United States Patent
Hegblom

(10) Patent No.: US 10,205,303 B1
(45) Date of Patent: Feb. 12, 2019

(54) VERTICAL-CAVITY SURFACE-EMITTING LASER THIN WAFER BOWING CONTROL

(71) Applicant: Lumentum Operations LLC, Milpitas, CA (US)

(72) Inventor: Eric R. Hegblom, Milpitas, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/787,029

(22) Filed: Oct. 18, 2017

(51) Int. Cl.
  *H01S 5/42* (2006.01)
  *H01S 5/183* (2006.01)
  *H01S 5/042* (2006.01)

(52) U.S. Cl.
  CPC .......... *H01S 5/183* (2013.01); *H01S 5/18305* (2013.01); *H01S 5/423* (2013.01); *H01S 5/0425* (2013.01)

(58) Field of Classification Search
  CPC ...... H01S 5/423; H01S 5/183; H01S 5/18305; H01S 5/0425
  See application file for complete search history.

(56) References Cited

U.S. PATENT DOCUMENTS

| | | | |
|---|---|---|---|
| 5,594,751 A | 1/1997 | Scott | |
| 6,898,215 B2 | 5/2005 | Naone et al. | |
| 7,215,692 B2 | 5/2007 | Jewell | |
| 7,286,584 B2 | 10/2007 | Wang et al. | |
| 7,346,090 B2 | 3/2008 | Johnson et al. | |
| 8,093,143 B2 | 1/2012 | Storck et al. | |
| 8,411,722 B2 | 4/2013 | Hori | |
| 8,451,875 B2 | 5/2013 | Johnson | |
| 9,520,696 B2 | 12/2016 | Wang et al. | |
| 2005/0019973 A1 | 1/2005 | Chua | |
| 2005/0100070 A1 | 5/2005 | Nakayama et al. | |
| 2005/0184303 A1* | 8/2005 | Tandon | H01L 33/145 257/98 |
| 2007/0057270 A1 | 3/2007 | Bour et al. | |
| 2011/0026555 A1 | 2/2011 | Takeuchi | |
| 2013/0099357 A1 | 4/2013 | Dargis et al. | |
| 2013/0270575 A1 | 10/2013 | Humphreys et al. | |
| 2015/0255955 A1* | 9/2015 | Wang | H01S 5/0224 438/29 |

(Continued)

FOREIGN PATENT DOCUMENTS

| | | |
|---|---|---|
| EP | 0 905 835 | 3/1999 |
| JP | 2006 0310534 A | 11/2006 |

OTHER PUBLICATIONS

U.S. Non-Final Office Action for U.S. Appl. No. 15/655,470, dated Jan. 19, 2018, 21 pages.

(Continued)

*Primary Examiner* — Michael Carter
(74) *Attorney, Agent, or Firm* — Harrity & Harrity, LLP

(57) ABSTRACT

A vertical-cavity surface-emitting laser (VCSEL) wafer, may include: a substrate layer, epitaxial layers grown on the substrate layer, and a strain compensating layer to control bowing of the VCSEL wafer after thinning of the VCSEL wafer. The strain compensating layer may be arranged on an epitaxial side of the substrate layer. The strain compensating layer may control bowing of the thinned VCSEL wafer by at least partially compensating for compressive strain in the epitaxial layers of the VCSEL wafer.

20 Claims, 8 Drawing Sheets

(56) References Cited

U.S. PATENT DOCUMENTS

2017/0148747 A1    5/2017  Chang et al.
2017/0162522 A1    6/2017  Chang et al.

OTHER PUBLICATIONS

Hodge et al., "Stresses in Thin Film Metallization", http://kohl.chbe.gatech.edu/sites/default/files/linked_files/publications/1997_Stresses%20in%20Thin%20Film%20Metals.pdf, 1997, 10 pages.
Bilir et al., "Stress and Other Challenges with Evaported Ni—Cr Thin Film Resistors Used in the Manufacture of ASICs", http://csmantech.org/OldSite/Digests/2003/2003PDF/8-20.pdf, 2003, 4 pages.
Solid State Technology, "PVD Processing for Flip Chip", http://electroiq.com/blog/2007/09/pvd-processing-for-flip-chip/, 2017, 8 pages.
Williams, "Modern GaAs processing techniques", 1990 Artech House, Inc., ISBN 0-89006-343-5, 6 pages.
Branger et al., "Study of the mechanical and microstructural state of platinum thin films", Thin Solid Films 275 (1996) 22-24, 3 pages.
Extended European Search Report for corresponding EP Application No. 18165192.8, dated Dec. 6, 2018, 8 pages.

\* cited by examiner

VERTICAL-CAVITY SURFACE-EMITTING LASER THIN WAFER BOWING CONTROL

TECHNICAL FIELD

The present disclosure relates generally to vertical-cavity surface-emitting lasers (VCSELs) and, more particularly, to bowing control for thin VCSEL wafers.

BACKGROUND

A vertical-emitting device, such as a VCSEL, is a laser in which a laser beam is emitted in a direction perpendicular to a surface of a substrate (e.g., vertically from a surface of a semiconductor wafer). A typical VCSEL includes epitaxial layers grown on a substrate. The epitaxial layers may include, for example, a pair of reflectors (e.g., a pair of distributed Bragg reflectors (DBRs)), an active region, an oxidation layer, and/or the like. Other layers may be formed on or above the epitaxial layers, such as one or more dielectric layers, metal layers, and/or the like.

SUMMARY

According to some possible implementations, a VCSEL wafer may include: a substrate layer; epitaxial layers on the substrate layer; and a strain compensating layer to control bowing of the VCSEL wafer after thinning of the VCSEL wafer, wherein the strain compensating layer may be arranged on an epitaxial side of the substrate layer, and wherein the strain compensating layer may control bowing of the thinned VCSEL wafer by at least partially compensating for compressive strain in the epitaxial layers of the VCSEL wafer.

According to some possible implementations, a VCSEL may include: a substrate layer; epitaxial layers on the substrate layer; and a strain compensating layer to control bowing of a thinned VCSEL wafer by at least partially compensating for compressive strain in the epitaxial layers of the thinned VCSEL wafer, wherein the strain compensating layer is arranged between portions of an anode layer on an epitaxial side of the substrate layer, or wherein the strain compensating layer is at least partially embedded in a dielectric passivation/mirror layer on the epitaxial side of the substrate.

According to some possible implementations, a thinned wafer of surface-emitting lasers may include: epitaxial layers on a substrate layer; and a strain compensating layer to control bowing of the thinned wafer by at least partially compensating for compressive strain in the epitaxial layers of the thinned wafer, wherein the strain compensating layer is arranged on an epitaxial side of the substrate layer, and wherein the strain compensating layer is one of: arranged between portions of an anode layer of the thinned wafer, or at least partially embedded in a dielectric passivation/mirror layer of the thinned wafer.

DETAILED DESCRIPTION

Figure 1A:
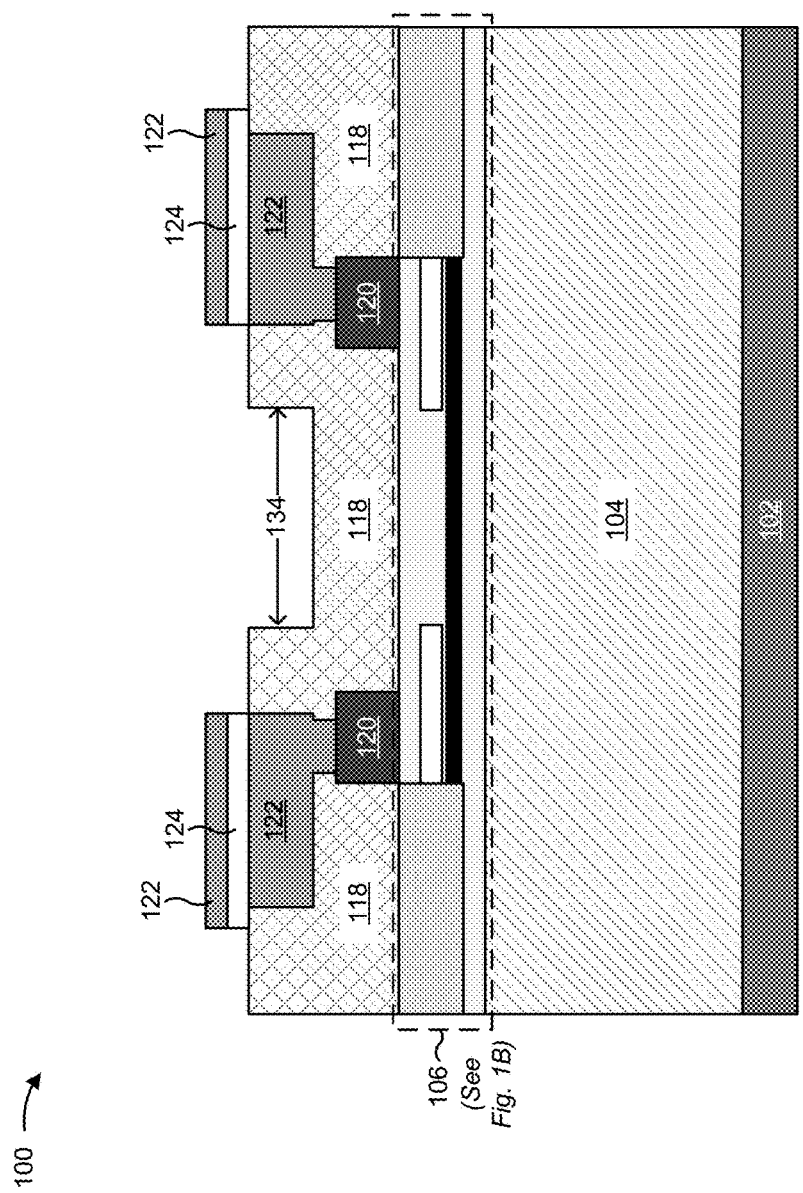
FIG. 1A is a diagram depicting a cross-sectional view of a first example VCSEL design, associated with controlling thinned VCSEL wafer bowing, that includes a strain compensating layer on an epitaxial side of a substrate.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations. In the following detailed description, the term VCSEL is used synonymously for a single VCSEL or an array of VCSELs unless stated otherwise. Furthermore, while layers are described as being associated with or used by a single VCSEL, in some implementations, a VCSEL layer may be shared by VCSELs in a VCSEL array. For example, while anode layers and cathode layers are described as being associated with or used by a single VCSEL (e.g., such that each VCSEL has an anode layer and a cathode layer that is separate from those of another adjacent VCSEL), in some implementations, two or more VCSELs of a VCSEL array (e.g., within a die formed on a VCSEL wafer) may share a common anode layer or a common cathode layer.

During fabrication, a VCSEL wafer (e.g., a wafer including multiple individual VCSELs) may be thinned in order to, for example, facilitate die separation. For example, the VCSEL wafer may be thinned such that the VCSEL wafer has a thickness in a range from approximately 70 micrometers ($\mu m$) to approximately 300 $\mu m$.

However, a thinned VCSEL wafer may experience bowing due to strain associated with one or more layers of the VCSEL wafer, such as epitaxial layers, dielectric layers, metal layers, and/or the like. For example, when fabricated using conventional materials (e.g., Aluminum Gallium Arsenide (AlGaAs) epitaxial layers, Silicon Nitride (SiNx) dielectric layer(s), a Titanium (Ti)/Platinum (Pt)/Gold (Au) anode, a Gallium Arsenide (GaAs) substrate, a Gold-Germanium (Au—Ge) backside cathode, and/or the like), a VCSEL wafer with a diameter of 6 inches (e.g., approximately 15.24 centimeters (cm)) may bow one or more centimeters after thinning to approximately 100 $\mu m$. Such bowing may cause the VCSEL wafer to be fragile or difficult to handle, transport, or test without a risk of breakage. In contrast, a "thick" wafer (e.g., with a thickness from approximately 400 $\mu m$ to approximately 700 $\mu m$) used during the fabrication process may bow less for the same amount of top-side and bottom-side strain.

A VCSEL wafer presents a particular challenge since epitaxial layers (e.g., composed of AlGaAs) of the typical VCSEL wafer are thicker and have a higher average Al mole fraction than some other types of AlGaAs/GaAs wafers, such as those for edge emitting lasers or field-effect transistors. For example, epitaxial layers of the typical VCSEL wafer (e.g., AlGaAs epitaxial layers grown on a GaAs substrate) may have a thickness of approximately 10 µm and an average Al mole fraction of approximately 50% or higher (e.g., the Al mole fraction may be greater than 70% for low index layers among the epitaxial layers), while epitaxial layers of some other types of AlGaAs/GaAs wafers may have a thickness of a few micrometers and an average Al mole fraction of less than 50%. Since AlGaAs, when grown on a GaAs substrate, is compressively stressed, the epitaxial layers contribute most of the integrated strain in the VCSEL wafer and, thus, cause most of the VCSEL wafer bowing. As such, the integrated strain, and the resultant wafer bowing, may be of a particular concern for a VCSEL wafer.

If AlGaAs substrates were readily available, and if high quality epitaxial layers could be grown upon such AlGaAs substrates, then such strain and bowing may not be an issue. However, AlGaAs substrates are not readily available (e.g., commercially) and, even if such substrates were available, the presence of aluminum on a surface of the AlGaAs substrate would increase complexity associated with growing the epitaxial layers (e.g., due to formation of a thin surface oxide on the AlGaAs substrate surface that would result upon exposure of the AlGaAs substrate surface to air).

Further, the VCSEL wafer bowing issue could potentially be resolved by removing the GaAs substrate from the VCSEL wafer (e.g., with selective etching). However, removal of the GaAs substrate would result in a significantly more fragile AlGaAs VCSEL wafer with a thickness of approximately 10 µm. Additionally, the VCSEL wafer bowing issue could potentially be resolved by removing a portion of the epitaxial material or making thin, closely spaced slots in the epitaxial material (e.g., slots spaced less than approximately 200 µm apart). However, in order to permit close spacing of VCSELs in a VCSEL array (e.g., with spacing that is less than approximately 60 µm), a substantially planar surface is needed.

Some implementations described herein provide VCSEL designs for controlling (e.g., reducing, compensating, and/or the like) wafer bowing of a thinned VCSEL wafer, thereby reducing fragility of the VCSEL wafer and/or making the thinned VCSEL wafer easier to handle, transport, test, and/or the like, with a reduced risk of breakage (e.g., as compared to a conventional VCSEL wafer). Notably, the wafer bowing addressed by the designs described herein is bowing experienced by a thinned (e.g., finished) VCSEL wafer, rather than bowing experienced during intermediate steps of VCSEL wafer fabrication (e.g., experienced when the substrate has a thickness that is greater than approximately 300 µm).

Further, while the designs described herein are described in the context of VCSELs, these designs may be applied to another type of emitter and/or optical device, such as a light emitting diode (LED), or another type of vertical emitting (e.g., top emitting or bottom emitting) optical device. Additionally, the designs described herein may apply to VCSELs, other types of emitters, and/or other types of optical devices of any wavelength, power level, emission profile or the like. In other words, the designs described herein are not particular to a VCSEL, other types of emitters, or optical devices with a given performance characteristic.

FIGS. 1A-1G are diagrams depicting cross-sectional views associated with various example VCSEL designs for controlling bowing of thinned VCSEL wafers.

FIG. 1A is a diagram depicting a cross-sectional view of a first example VCSEL design, associated with controlling thinned VCSEL wafer bowing that includes a strain compensating layer on an epitaxial side of a substrate.

As shown in FIG. 1A, the first example VCSEL design provides a VCSEL 100 that includes a backside cathode layer 102, a substrate layer 104, epitaxial layers 106 (e.g., shown in further detail in FIG. 1B), a dielectric passivation/mirror layer 118, an ohmic-contact metal layer 120, anode layer 122, and an epitaxial-side strain compensating metal layer 124 (herein referred to as epi-side metal layer 124). In some implementations, VCSEL 100 may be manufactured using a series of procedures. For example, one or more layers of VCSEL 100 may be created using one or more growth procedures, one or more deposition procedures, one or more etching procedures, one or more oxidation procedures, one or more implantation procedures, one or more metallization procedures, and/or the like.

Backside cathode layer 102 includes an electrode layer that makes electrical contact with substrate layer 104 (e.g., a backside of substrate layer 104, shown as a bottom side of substrate layer 104 in FIG. 1A). For example, backside cathode layer 102 may include an annealed metallization layer, such as a Gold-Germanimum-Nickel (AuGeNi) layer, a Palladium-Germanium-Gold (PdGeAu) layer, and/or the like.

Substrate layer 104 includes a substrate upon which epitaxial layers 106 of VCSEL 100 are grown. In some implementations, substrate layer maybe formed from a semiconductor material, such as GaAs, Indium Phosphide (InP), and/or another type of semiconductor material.

Epitaxial layers 106 include a set of layers grown on substrate layer 104. For example, epitaxial layers 106 may include an optical resonator including pair of reflectors (e.g., a pair of Distributed Bragg Reflectors (DBRs), a pair of dielectric mirrors, and/or the like) and an active gain medium (herein referred to as an active region), one or more layers used to form one or more apertures (e.g., for optical and/or electrical confinement), and/or the like. In some implementations, epitaxial layers 106 may include a set of AlGaAs layers grown on substrate layer 104 (e.g., a GaAs substrate). In some implementations, epitaxial layers 106 may be grown on substrate layer 104 using a Metal-Organic Chemical Vapor deposition (MOCVD) technique, a Molecular beam Epitaxy (MBE) technique, and/or the like. In some implementations, epitaxial layers 106 may have a thickness in a range from approximately 7 µm to approximately 16 µm, such as 8 µm or 10 µm. As described in further detail below, epitaxial layers 106 may be compressively strained when grown on substrate layer 104, the compensation for which may be provided by epi-side metal layer 124.

Figure 1B:
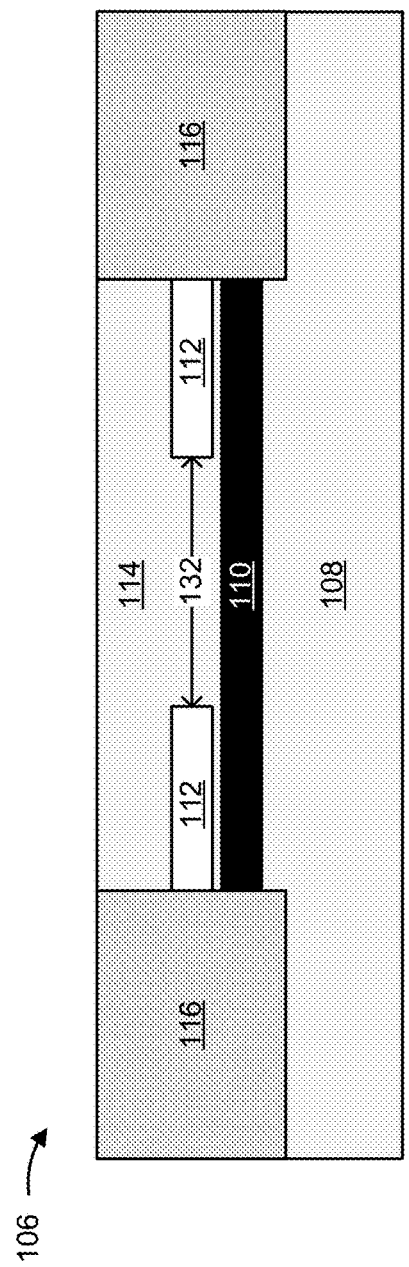
FIG. 1B is a diagram depicting a cross-sectional view of example epitaxial layers of example VCSELs, described herein, including additional features found in finished VCSELs.

As noted in FIG. 1A, and with reference to FIG. 1B, epitaxial layers 106 of VCSEL may include a bottom mirror 108, an active region 110, an oxidation layer 112 (defining an oxidation aperture 132), a top mirror 114, and isolation material 116.

Bottom mirror 108 includes a bottom reflector of an optical resonator of VCSEL 100. For example, bottom mirror 108 may include a distributed Bragg reflector (DBR), a dielectric mirror, and/or the like. In some implementations, bottom mirror 108 may have a thickness in a range from approximately 3.5 µm to approximately 9 µm, such as 5 µm.

Active region 110 includes one or more layers where electrons and holes recombine to emit light and define the emission wavelength range of the VCSEL 100. For example, active region 110 may include one or more quantum wells. The active region 110 also includes cavity spacer layers between the DBR mirrors 114 and 108. The optical thickness of the active region 110 (including cavity spacer layers) and optical thickness of the DBR mirrors 114 and 108 define the resonant cavity wavelength of the VCSEL 100 which is designed within the emission wavelength range of the active region to enable lasing. In some implementations, active region 110 may have a thickness in a range from approximately 0.06 µm to approximately 0.5 µm, such as 0.15 µm or 0.30 µm.

Oxidation layer 112 includes an oxide layer that provides optical and electrical confinement. In some implementations, oxidation layer 112 may be formed as a result of oxidation of one or more epitaxial layers. For example, oxidation layer 112 may be an Aluminum Oxide ($Al_2O_3$) layer formed as a result of oxidation of an epitaxial layer (e.g., a AlGaAs layer, an Aluminum Arsenide (AlAs) layer, and/or the like). In some implementations, oxidation layer 112 may have a thickness in a range from approximately 0.007 µm to approximately 0.04 µm, such as 0.02 µm. In some implementations, oxidation trenches (not shown) etched around VCSEL 100 may allow steam to access the epitaxial layer from which oxidation layer 112 is formed. As shown, oxidation layer 112 may define oxidation aperture 132 (e.g., an optically active aperture). In some implementations, the oxide aperture 132 may be a non-circular shape, but a circle of approximately the same area may have a diameter in a range from approximately 1 µm to approximately 300 µm, such as 5 µm or 8 µm.

Top mirror 114 includes a top reflector layer of VCSEL 100. For example, top mirror 114 may include a DBR, a dielectric mirror, and/or the like. In some implementations, top mirror 114 may have a thickness in a range from approximately 2 µm to approximately 6 µm, such as 4 µm.

Isolation material 116 includes a material that provides electrical isolation of VCSEL 100. For example, isolation material 116 may include an ion implanted material, such as a Hydrogen implanted material or a Hydrogen/Proton implanted material. In some implementations, isolation material 116 may be formed by applying an ion implanting process to one or more epitaxial layers grown on substrate layer 104. In some implementations, isolation material 116 may have a thickness in a range from approximately 3 µm to approximately 7 µm, such as 5 µm.

Returning to FIG. 1A, dielectric passivation/mirror layer 118 includes a layer that acts as a protective passivation layer and/or that acts as an additional DBR. For example, dielectric passivation mirror layer may include one or more sub-layers (e.g., a Silicon Dioxide ($SiO_2$) layer, a SiNx layer, and/or the like) deposited (e.g., via chemical vapor deposition) on one or more epitaxial layers 106 of VCSEL 100 (e.g., isolation material 116 and top mirror 114). In some implementations, dielectric passivation/mirror layer 118 may have a thickness in a range from approximately 0.25 µm to approximately 2.5 µm, such as 1.5 µm. As shown, a portion of dielectric passivation/mirror layer 118 over oxidation aperture 132 may form an optical aperture 134 (e.g., an aperture via which light may be emitted). In some implementations, optical aperture 134 is defined by the diameter of oxidation aperture 132, and an additional aperture may be formed in dielectric passivation/mirror layer 118 for mode selectivity. In some implementations, optical aperture 134 may have a diameter in a range from approximately 2 µm to approximately 300 µm, such as 15 µm. As further shown, dielectric passivation/mirror layer 118 may include one or more openings (e.g., formed by etching) that provide electrical access to ohmic-contact metal layer 120.

Figure 1C:
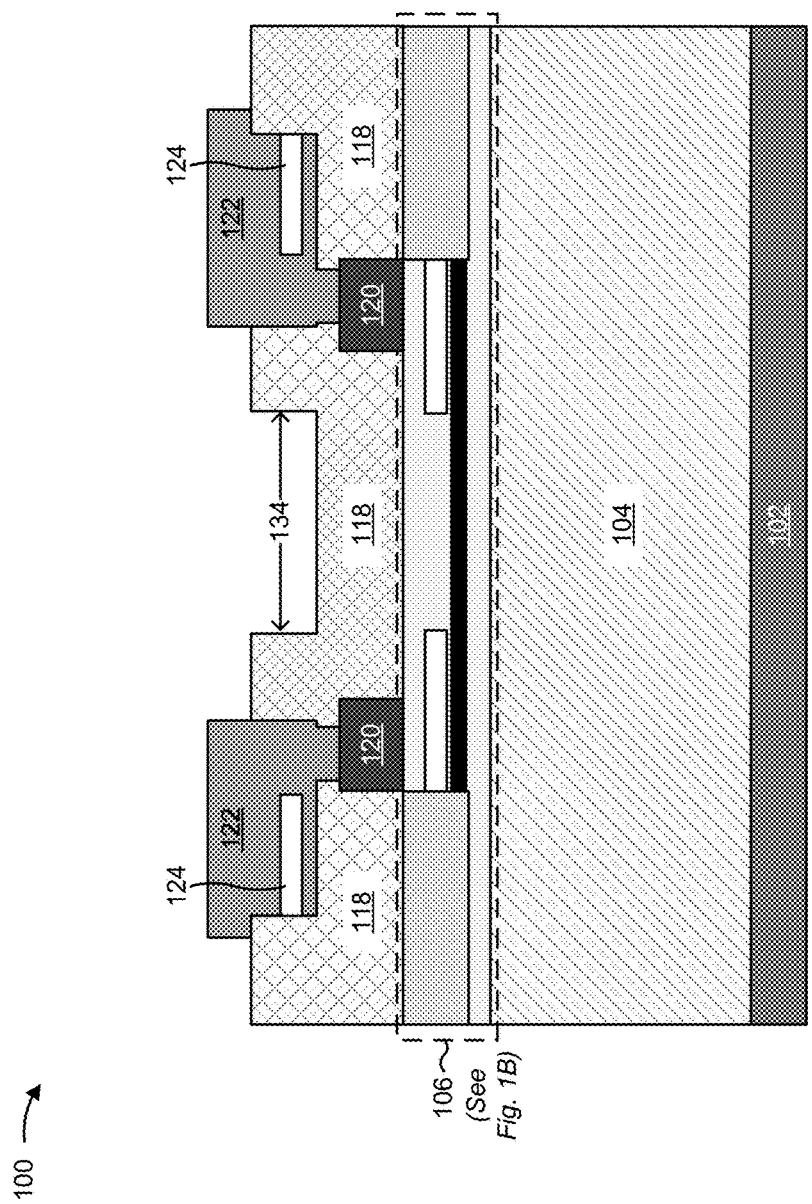
FIG. 1C is a diagram depicting a cross-sectional view of an alternative of the first example VCSEL design, associated with controlling thinned VCSEL wafer bowing, that includes a strain compensating layer on an epitaxial side of a substrate.
Figure 1D:
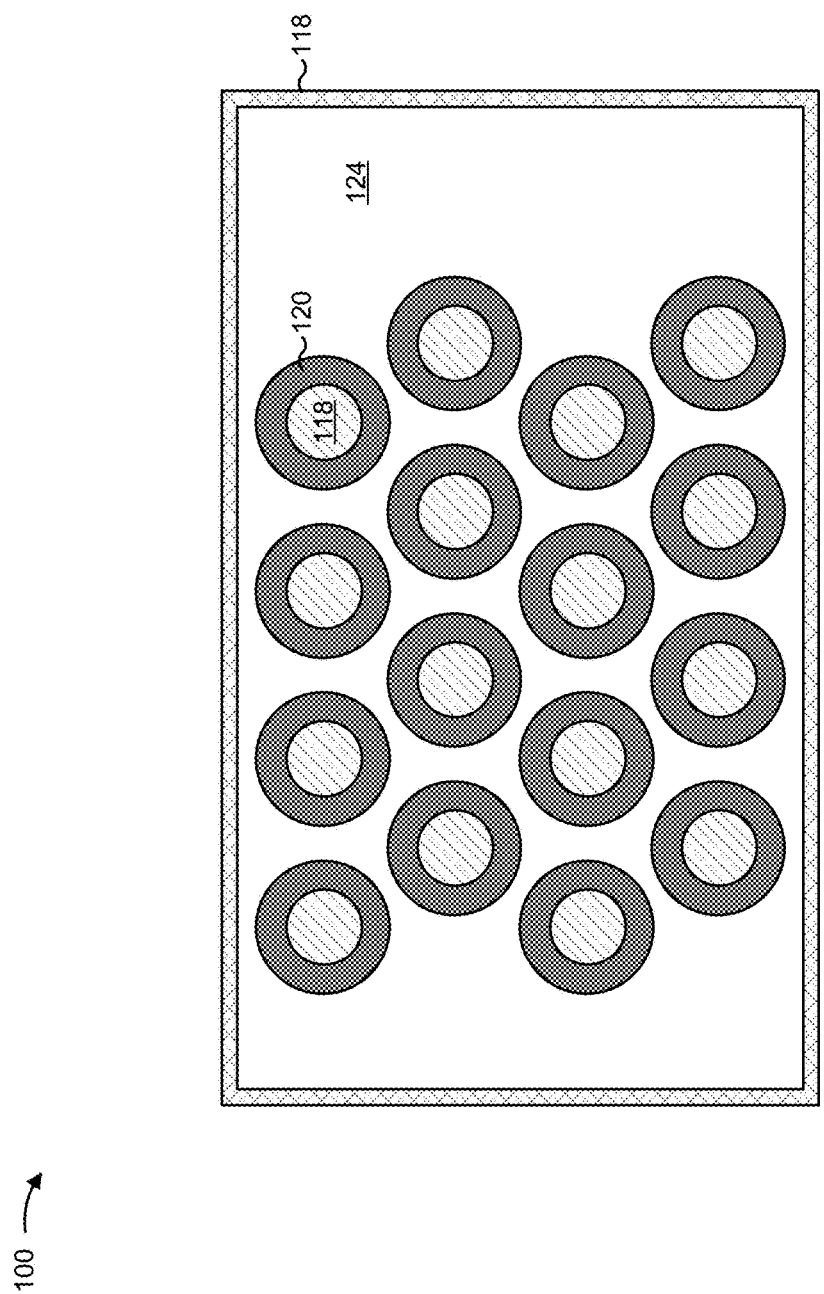
FIGS. 1D and 1E are top-views depicting an example relationship between an epi-side strain compensating layer and an ohmic-contact metal layer in the first example VCSEL designs.
Figure 1E:
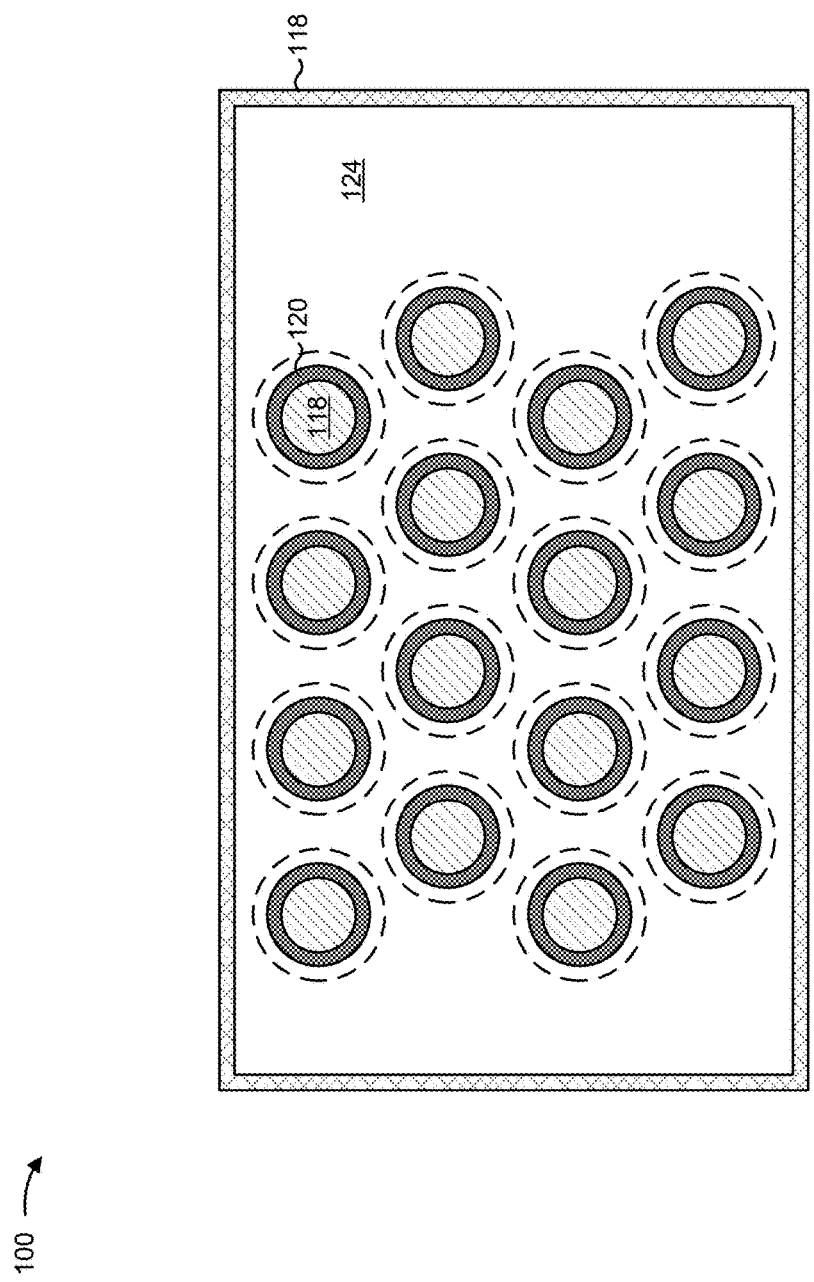

Ohmic-contact metal layer 120 includes a layer that makes electrical contact with the semiconductor through which current may flow. Ohmic-contact metal layer 120 may include an annealed metallization layer. For example, ohmic-contact metal layer 120 may include a Chromium-Gold (Cr—Au) layer, Gold-Zinc (Au—Zn), a Titanium-Platinum-Gold (TiPtAu) layer, or the like, through which electrical current may flow. In some implementations, ohmic-contact metal layer 120 may have a thickness in a range from approximately 0.03 µm to approximately 0.3 µm, such as 0.2 µm. In some implementations, ohmic-contact metal layer 120 may have a ring shape (e.g., as illustrated in FIGS. 1D and 1E), a slotted ring shape, or another type of circular or non-circular shape (e.g., depending on the VCSEL design). While not shown, in some implementations, ohmic-contact metal layer 120 is deposited such that ohmic-contact metal layer 120 does not extend over or into a cavity used for oxidation, etching, and/or the like.

Anode layer 122 includes one or more electrode layers for making electrical contact with ohmic-contact metal layer 120 (e.g., through vias in dielectric passivation/mirror layer 118). As shown in FIG. 1A, in VCSEL 100, anode layer 122 may be formed such that epi-side metal layer 124 is disposed between two portions of anode layer 122. For example, a first portion of anode layer 122 may be deposited on dielectric passivation/mirror layer 118, followed by deposition of epi-side metal layer 124, followed by deposition of a second portion of anode layer 122. In some implementations, the first portion of anode layer 122 may have a thickness in a range from approximately 0 µm to approximately 0.5 µm, such as 0.2 µm, while the second portion of anode layer 122 may have a thickness in a range from approximately 0.2 µm to approximately 4 µm, such as 2 µm. Alternatively, in another design anode layer 122 may be a single layer (e.g., such that no other layer is disposed between portions of anode layer 122). Generally, anode layer 122 may be at least partially embedded in dielectric passivation/mirror layer 118, may be arranged on dielectric passivation/mirror layer 118 (e.g., such that dielectric passivation/mirror layer does not cover any portion of a top surface of anode layer 122), may be arranged on a first portion of dielectric passivation/mirror layer 118 and partially covered by a second portion of dielectric passivation/mirror layer 118 (e.g., such that an opening in dielectric passivation/mirror layer 118 is formed on a portion of a top surface of epi-side metal layer 124), and/or the like.

Epi-side metal layer 124 includes a metal layer, arranged on an epitaxial side of substrate layer 104, that compensates (e.g., partially compensates, fully compensates, or over compensates) for strain of epitaxial layers 106 (and/or one or more other epitaxial-side layers VCSEL 100 that are compressively strained). As shown in FIG. 1A, epi-side metal layer 124 may be arranged on the epitaxial side of substrate layer 104 (e.g., a side of substrate layer 104 on which epitaxial layers 106 are grown, shown as a top side of substrate layer 104 in FIG. 1A). For example, as shown in FIG. 1A, in some implementations, epi-side metal layer 124 may be disposed in between portions of anode layer 122.

As described above, epitaxial layers 106 may be compressively strained. In order to compensate for the compressive stress in epitaxial layers 106, either the integrated stress-thickness-product for layers on the epitaxial side of substrate layer 104 and layers on the non-epitaxial side of substrate layer 104 (e.g., the side of substrate layer 104 opposite from that on which epitaxial layers 106 are grown, shown as a bottom side of substrate layer 104 in FIG. 1A) should be approximately equal to zero or, alternatively, the integrated stress-thickness product for the layers on the epitaxial side should be approximately equal to the integrated stress-thickness product for layers on the non-epitaxial side. These conditions may be expressed as $F_T$=0 and $F_B$=0, and $F_T$=$F_B$, respectively, where $F_T$ represents the integrated stress-thickness product for the layers on the epitaxial side and $F_B$ represents the integrated stress-thickness product for the layers on the non-epitaxial side. $F_T$ and $F_B$ may be calculated as:

$$F_T = \Sigma_{TopFilms} \sigma_j t_j$$

$$F_B = \Sigma_{BottomFilms} \sigma_j t_j$$

where $\sigma_j$ and $t_j$ are the stress and thickness of a jth layer.

Using a typical value for a thickness of AlGaAs epitaxial layers 106 (e.g., approximately 10 μm) an integrated stress-thickness product associated with epitaxial layers 106 may be approximately 400 Pascal-meters (Pa-m). Thus, in order to (at least partially) compensate for this compressive strain, and in order to avoid adding excessive thickness (e.g., by adding no more than a few micrometers to the overall thickness of the VCSEL), the stress of a layer used to compensate for that of epitaxial layers 106 should be approximately 200 Megapascal (MPa) or more (e.g., since 200 MPa×2 μm=400 Pa-m).

With regard to VCSEL 100, epi-side metal layer 124 should be composed of a tensile strained material in order to compensate for the compressive strain of epitaxial layers 106 (e.g., since epi-side metal layer 124 is arranged on the epitaxial side of substrate layer 104).

In some implementations, epi-side metal layer 124 may be a metallic layer. Generally, metals have a coefficient of thermal expansion that is greater than that of semiconductor materials such as AlGaAs and GaAs and, when deposited or plastically deformed (e.g., at a high temperature), may experience tensile strain at room temperature (e.g., as compared to that of a typical semiconductor material). Thus, in some implementations, epi-side metal layer 124 may be formed from a metallic material, such as Nickel-Chromium (NiCr), Chromium (Cr), or platinum (Pt) or another type of metal or alloy.

Evaporated NiCr has a tensile stress in a range from approximately 500 MPa to approximately 1000 MPa. As such, when epi-side metal layer 124 is formed from NiCr, epi-side metal layer 124 may at least partially compensate for the compressive strain of epitaxial layers 106 (e.g., since 500 MPa>200 MPa). The tensile stress of NiCr depends on a ratio of Ni to Cr, where a relatively higher amount of Ni reduces the tensile stress of the NiCr. Thus, the Ni to Cr ratio of epi-side metal layer 124 may define the tensile stress of epi-side metal layer 124. In some implementations, the Ni to Cr ratio of epi-side metal layer 124 may be in a range from 0 to 6, such as 4.

In some implementations, in order to provide an amount of tensile stress in the range indicated above, NiCr may require a thickness in a range from approximately 0.2 μm to approximately 0.4 μm for a blanket film. However, in the case VCSELs which emit light from the epi-side openings need to be provided in order to permit light to be emitted via optical aperture 134. In order to provide such openings, epi-side metal layer 124 may be patterned on a wafer of VCSELs 100. However, such openings in epi-side metal layer 124 may reduce the amount of strain compensation provided by epi-side metal layer 124 (e.g., as compared to a blanket layer with no openings). Thus, in some implementations, epi-side metal layer 124 may need to have an increased thickness (e.g., as compared to a blanket film) in order to provide adequate strain compensation. For example, in order to provide strain compensation, a NiCr epi-side metal layer 124 may have a thickness in a range from approximately 0.2 μm to approximately 0.7 μm, such as 0.3 μm.

As described above, Pt may also be deposited as an epi-side metal layer 124. The range of stress and resulting thickness required is similar to NiCr depending upon on the deposition rate. In the case of Pt, a thin layer of Ti underneath the Pt may be used to promote adhesion (herein referred to as an adhesion layer). In some implementations, such a Ti layer may have a thickness in a range from approximately 0.005 μm to approximately 0.030 μm, such as 0.010 μm. Although Pt is often used as part of a Ti/Pt/Au contact to p-type GaAs, the thickness range for Pt used for strain compensation may be greater than a thickness typically used in a contact layer, where the thickness generally is in a range from 0.02 μm to 0.06 μm and is required as a barrier to Gold intermixing with the semiconductor.

In some implementations, as shown in FIG. 1A, epi-side metal layer 124 may be patterned such that epi-side metal layer 124 fully overlaps a portion of anode layer 122 embedded in or arranged on dielectric passivation/mirror layer 118. Alternatively, epi-side metal layer 124 may partially overlap the portion of anode layer 122 embedded in or arranged on dielectric passivation/mirror layer 118. FIG. 1C is a diagram of an alternative design for VCSEL 100 where epi-side metal layer 124 partially overlaps a portion of anode layer 122 embedded in dielectric passivation/mirror layer 118. In some implementations, forming epi-side metal layer 124 with such a partial overlap may reduce or minimize electrical resistance in VCSEL 100 introduced by epi-side metal layer 124 (e.g., as compared to the design shown in FIG. 1A) by, for example, keeping epi-side metal layer 124 out of a direct path of current flow from anode layer 122 and ohmic-contact metal layer 120 to epitaxial layers 106. In some implementations, such partial overlap may be achieved by reducing an area on which epi-side metal layer 124 is patterned on a first portion of anode layer 122.

In some implementations, epi-side metal layer 124 may be patterned on portions of anode layer 122, on portions of dielectric passivation/mirror layer 118, and/or the like. In some implementations, epi-side metal layer 124 may be patterned using a lift-off step, an etching step, and/or the like.

In some implementations, epi-side metal layer 124 may be patterned such that epi-side metal layer 124 covers as large an area as possible without interfering with device characteristics (e.g., electro-optical characteristics) of VCSELs 100. Such characteristics may include, for example, electrical current versus voltage response, optical power versus electrical current response, divergence characteristics (e.g., far-field) of the light versus electrical current, a pattern of light emitted (e.g., near-field), lasing wavelength, a variation of these characteristics under modulation of an applied electrical current, variation of these characteristics with temperature, and/or the like.

For example, epi-side metal layer 124 may be patterned such that epi-side metal layer 124 covers a majority of a surface of a wafer of VCSELs 100 without impacting operations of VCSELs 100 on the wafer. As a particular example, epi-side metal layer 124 may be patterned such that epi-side metal layer 124 does not cover any portion of ohmic-contact metal layer 120. FIG. 1D is a diagram that shows a top-view of an individual VCSEL array, with a common anode, in which epi-side metal layer 124 is patterned such that epi-side metal layer 124 does not cover any portion of ohmic-contact metal layer 120. A given individual emitter in the array of FIG. 1D may have cross-sectional view similar to that shown in FIG. 1C. In order to illustrate the relationship between epi-side metal layer 124 and ohmic-contact metal layer 120, portions of other layers (e.g., dielectric passivation/mirror layer 118, anode layer 122, and/or the like) are not shown in FIG. 1D. As shown in FIG. 1D, epi-side metal layer 124 may be patterned such that epi-side metal layer 124 does not cover any portion of ohmic-contact metal layer 120 (while otherwise covering a same area as a portion of anode layer 122 on the VCSEL wafer). In some implementations, such patterning may prevent epi-side metal layer 124 from interfering with characteristics of VCSELs 100 (e.g., by reducing or minimizing resistance introduced by epi-side metal layer 124).

As another example, epi-side metal layer 124 may be patterned such that epi-side metal layer 124 at least partially covers ohmic-contact metal layer 120 (e.g., such that epi-side metal layer 124 covers a substantially same area as anode layer 122). FIG. 1E is a diagram that shows a top-view of an individual VCSEL array, with a common anode, in which epi-side metal layer 124 is patterned such that epi-side metal layer 124 at least partially covers ohmic-contact metal layer 120. A given individual emitter in the array of FIG. 1E may have cross-sectional view similar to that shown in FIG. 1A. In order to illustrate the relationship between epi-side metal layer 124 and ohmic-contact metal layer 120, portions of other layers (e.g., dielectric passivation/mirror layer 118, anode layer 122, and/or the like) are not shown in FIG. 1E. As shown in FIG. 1E, epi-side metal layer 124 may be patterned such that epi-side metal layer 124 at least partially covers ohmic-contact metal layer 120, where the extent of ohmic-contact metal layer 120 associated with a given VCSEL 100 (beneath epi-side metal layer 124) is shown as a dashed circle in FIG. 1E. In some implementations, epi-side metal layer 124 may be patterned such that epi-side metal layer 124 covers a substantially same area as anode layer 122. Alternatively, epi-side metal layer 124 may be patterned such that epi-side metal layer 124 covers an area smaller than that covered by anode layer 122, while at least partially covering ohmic-contact metal layer 120. In some implementations, epi-side metal layer 124 may partially cover ohmic-contact metal layer 120 when epi-side metal layer 124 does not significantly change an amount of resistance between anode layer 122 and ohmic-contact metal layer 120.

In some implementations (e.g., those described in connection with FIGS. 1D and 1E), in order to allow for process alignment tolerances, epi-side metal layer 124 may be patterned such that an edge of epi-side metal layer 124 is at a particular distance from an edge of anode layer 122 and/or from an edge of ohmic-contact metal layer 120. For example, epi-side metal layer 124 may be patterned at a distance in a range from approximately 1 µm to approximately 3 µm from an edge of anode layer 122 and/or from an edge of ohmic-contact metal layer 120 in order to allow for process alignment tolerances associated with fabricating a wafer of VCSELs 100.

Figure 1F:
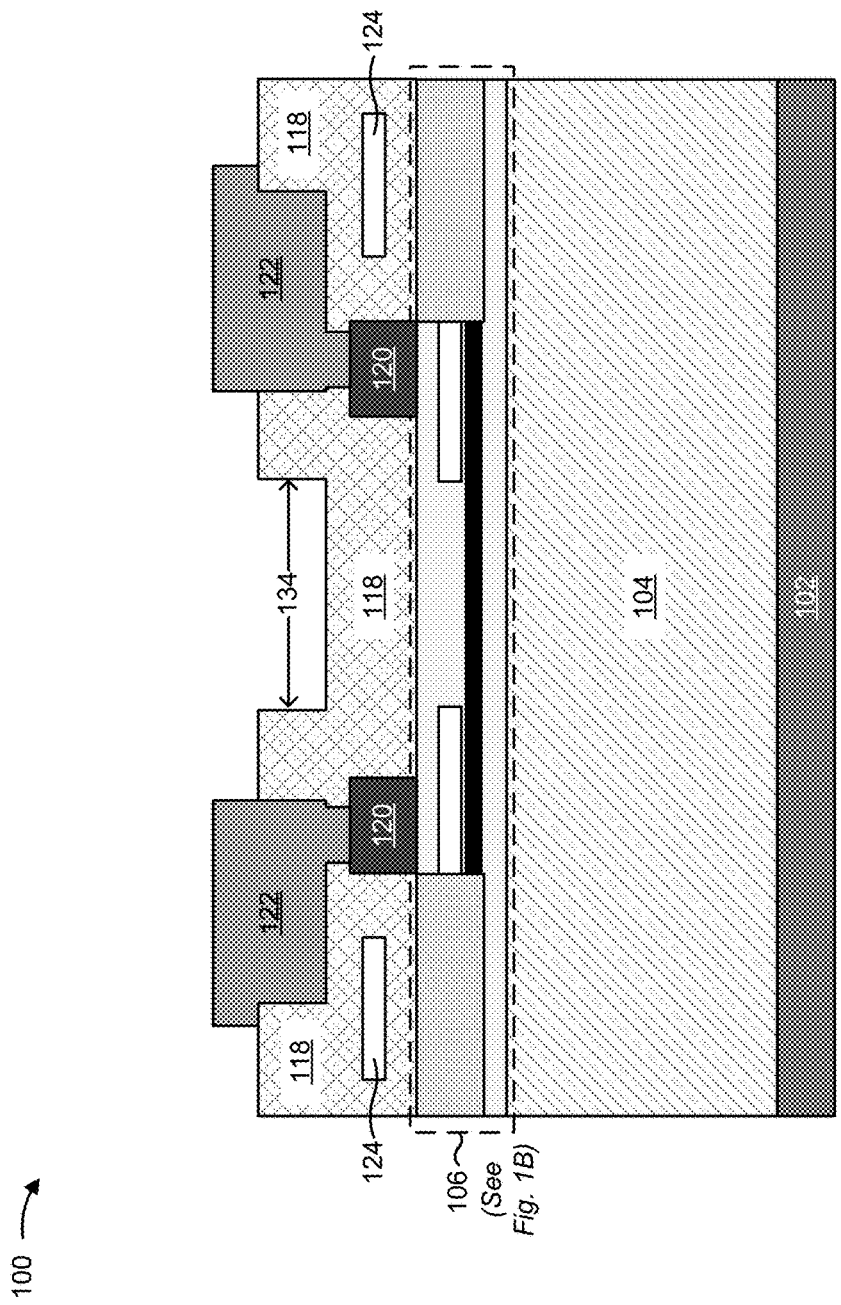
FIGS. 1F and 1G are diagrams depicting cross-sectional views of another alternative of the first VCSEL design, associated with controlling thinned wafer VCSEL bowing, that includes a strain compensating layer on an epitaxial side of a substrate.
Figure 1G:
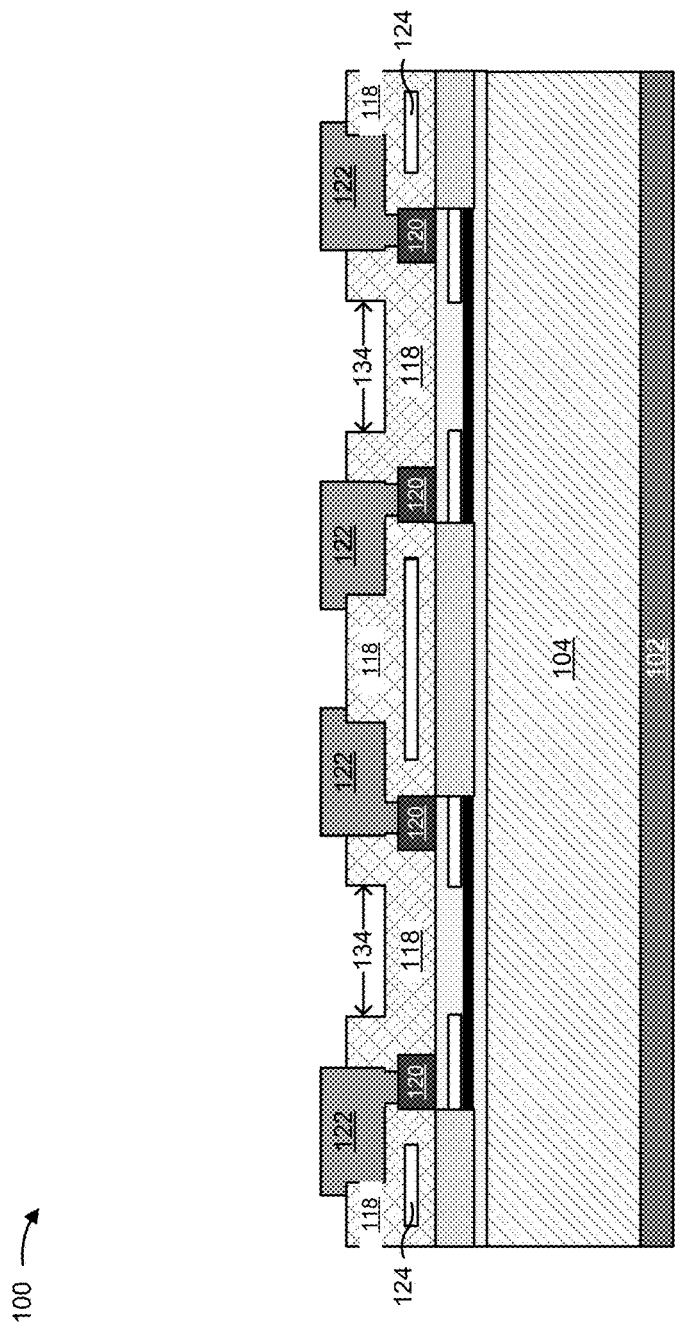

In some implementations, epi-side metal layer 124 may be at least partially embedded in dielectric passivation/mirror layer 118. FIGS. 1F and 1G are diagrams of an alternative design for VCSEL 100 where epi-side metal layer 124 is embedded in dielectric passivation/mirror layer 118. In a case where VCSELs on the VCSEL wafer share an anode layer 122, epi-side metal layer 124 may be patterned such that epi-side metal layer 124 of a given VCSEL 100 does not extend to an edge of the VCSEL, as shown in FIG. 1F. Alternatively, as shown in FIG. 1G, in a case where VCSELs 100 on the VCSEL wafer have separate anode layers 122, epi-side metal layer 124 may be patterned such that epi-side metal layer 124 covers a region between a given pair of VCSELs 100. In other words, in some implementations, epi-side metal layer 124 may be patterned to fully cover regions between the portions of anode layer 122 in order to maximize area-coverage and/or minimize film stress required for wafer bowing compensation.

In order to produce designs like those shown in FIGS. 1F and 1G, in some implementations, if epi-side metal layer 124 is deposited relatively early in the fabrication process (e.g., before ion implantation associated with forming isolation material 116) then epi-side metal layer 124 may be a barrier to subsequent ion implantation. Therefore, in some implementations, epi-side metal layer 124 may be deposited relatively later in the fabrication process (e.g., after ion implantation).

Implementations shown in FIGS. 1F and 1G may have a higher parasitic capacitance between anode layer 122 and backside cathode layer 102 and higher parasitic capacitance between separate portions of anode layers 122. This increase may be problematic for an application with a relatively high modulation speed since a response of the VCSEL will be slower and since there may be increased electrical cross-talk between separate anode layers 122. For example, consider a portion of anode layer 122 of a VCSEL 100 array or VCSEL 100 and a portion of epi-side metal layer 124 underneath the portion of anode layer 122. Here, if the portion of epi-side metal layer 124 underneath the portion of anode layer 122 is electrically connected to a relatively large area of epi-side metal layer 124 that is not under the portion of anode layer 122, then the capacitance between the portion of anode layer 122 and backside cathode layer 102 will be increased (e.g., as compared to that of a design without any epi-side metal). Further, if epi-side metal layer 124 under a first portion of anode layer 122 is electrically connected to another portion of epi-side metal later 124 that is under a second portion of anode layer 122, then the parasitic capacitance between the two portions of anode layer 122 may be significantly increased (e.g., as compared to a design without epi-side metal). Notably, VCSEL designs with epi-side metal layer 124 placed within anode layer 122 (e.g., the designs shown in FIGS. 1A and 1C) do not experience this issue because such designs have approximately a same area and position as an anode without epi-side metal.

In some implementations, anode layer 122 may contain relatively thick (e.g., from 1 µm to 5 µm) plated gold. Because pure gold easily deforms and may significantly reduce the strain in epi-side metal layer 124, epi-side metal layer 124 may be placed beneath any plated metal of VCSEL 100, in some implementations.

In some implementations, epi-side metal layer 124 may be designed to compensate for the compressive strain of epitaxial layers 106 such that a wafer of VCSELs 100 experiences no bowing. Alternatively, epi-side metal layer 124 may be designed to partially compensate or over compensate for the compressive strain of epitaxial layers 106 such that a wafer of VCSELs 100 experiences a particular amount of bowing (e.g., such that a small residual strain remains). In some implementations, a range for over compensation/under compensation may be within approximately +/−30% of the stress-thickness required to compensate the epitaxial strain. Such a design may be advantageous so that bowing is always in a same direction, to compensate for strain of other layers of VCSEL 100 that are part of a final wafer and device structure, and/or the like. Having a same resultant shape among VCSEL wafers (e.g., a concave bowing rather than convex bowing, convex bowing rather than concave bowing) may be beneficial when, for example, implementing a process for placing a VCSEL wafer on a vacuum-chuck and pulling the VCSEL wafer to a surface, when using automated handling tools associated with wafer testing, and/or the like. In this way, VCSEL 100 may be designed in order to at least partially compensate for compressive strain introduced by epitaxial layers 106, thereby controlling an amount of bowing experienced by a thinned wafer of VCSELs 100. In some implementations, epi-side metal layer 124 may also be designed to at least partially compensate for strain of another layer of VCSEL 100, such as dielectric passivation/mirror layer 118, another metal layer of VCSEL 100, and/or the like (e.g., such that the VCSEL wafer is nearly flat or experiences a particular amount of bowing).

Figure 2:
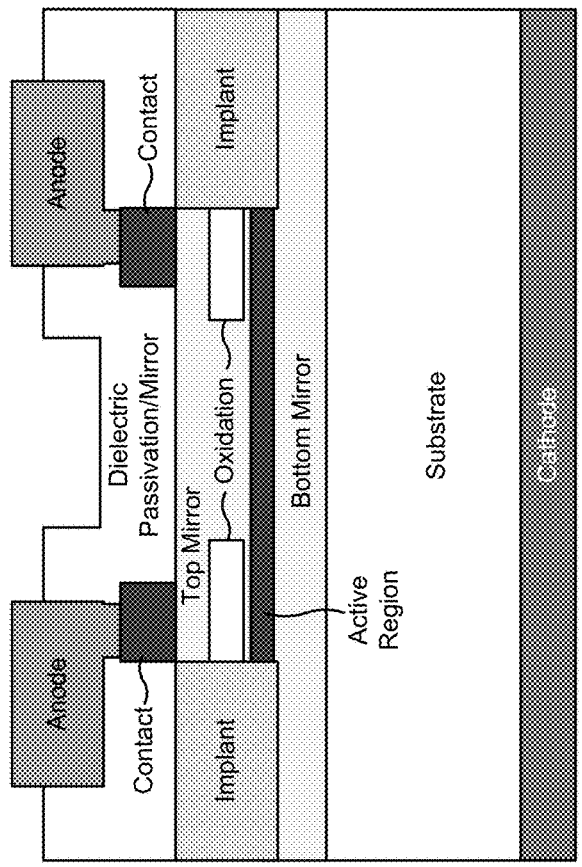
FIG. 2 is a diagram depicting a cross-sectional view of a conventional VCSEL design.

Notably, a conventional VCSEL does not include epi-side metal layer 124. In other words, the conventional VCSEL does not include a layer associated with controlling bowing of a thinned VCSEL wafer such as epi-side metal layer 124 of VCSEL 100. FIG. 2 is a diagram depicting a cross-sectional view of a conventional VCSEL design 200.

In some implementations, the design of VCSEL 100 may be used for a VCSEL that emits light through substrate layer 104 (i.e., bottom emitting) since, for example, epi-side metal layer 124 will not block the light as would a metal layer on the non-epitaxial side of substrate layer 104. While a dielectric layer on the non-epitaxial side of substrate layer 104 could be used in the case of such bottom emitting, such a design would require additional anti-reflection coatings which would add to design complexity and/or may be difficult to implement due to challenges associated with maintaining adhesion of a stress compensating dielectric layer.

The number and arrangement of layers shown in FIGS. 1A-1G are provided as an example. In practice, VCSEL 100 may include additional layers, fewer layers, different layers, differently arranged layers, layers with different thicknesses or relative thicknesses, and/or the like, than those shown in FIGS. 1A-1G. Further, while the VCSEL designs associated with FIGS. 1A-1C, 1F and 1G show cross sections for a single emitter, these designs may be applied to arrays of emitters (e.g., with or without a common anode and substrate-side cathode). Additionally, or alternatively, a set of layers (e.g., one or more layers) of VCSEL 100 may perform one or more functions described as being performed by another set of layers of VCSEL 100 respectively.

Some implementations described herein provide VCSEL designs for controlling (e.g., reducing, controlling, and/or the like) wafer bowing of a thinned VCSEL wafer, thereby reducing fragility of the VCSEL wafer and/or making the thinned VCSEL wafer easier to handle, transport, test, and/or the like, with a reduced risk of breakage (e.g., as compared to a VCSEL wafer with a conventional VCSEL design).

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical-cavity surface-emitting laser (VCSEL) wafer, comprising:
    a substrate layer;
    epitaxial layers on the substrate layer; and
    a strain compensating layer to control bowing of the VCSEL wafer after thinning of the VCSEL wafer,
        wherein the strain compensating layer is arranged outside of the epitaxial layers on an epitaxial side of the substrate layer and between at least a portion of an anode layer and the epitaxial layers, and
        wherein the strain compensating layer controls bowing of the thinned VCSEL wafer by at least partially compensating for compressive strain in the epitaxial layers of the VCSEL wafer.

2. The VCSEL wafer of claim 1, wherein the strain compensating layer is a metal layer with a thickness in a range from approximately 0.2 micrometers to approximately 0.7 micrometers.

3. The VCSEL wafer of claim 1, wherein the strain compensating layer is a Nickel-Chromium (NiCr) layer, a Platinum (Pt) layer, or a Chromium (Cr) layer.

4. The VCSEL wafer of claim 1, wherein the strain compensating layer is arranged between portions of the anode layer.

5. The VCSEL wafer of claim 4, wherein an adhesion layer, associated with promoting adhesion between the strain compensating layer and at least one portion of the anode layer, is arranged between the strain compensating layer and the at least one portion of the anode layer.

6. The VCSEL wafer of claim 5, wherein the adhesion layer is a Titanium (Ti) layer with a thickness in a range from approximately 0.005 micrometers to approximately 0.03 micrometers.

7. The VCSEL wafer of claim 4, wherein the strain compensating layer partially overlaps a portion of the anode layer in order to reduce or minimize electrical resistance associated with the strain compensating layer.

8. The VCSEL wafer of claim 1, wherein the strain compensating layer covers a majority of a surface of the VCSEL wafer.

9. The VCSEL wafer of claim 1, wherein the strain compensating layer is at least partially embedded in a dielectric passivation layer.

10. The VCSEL wafer of claim 1, wherein the strain compensating layer is patterned to include openings via which light is to be emitted by VCSELs of the VCSEL wafer.

11. The VCSEL wafer of claim 10, wherein a thickness of the strain compensating layer is selected to compensate for a decrease in strain compensation, provided by the strain compensating layer, that is caused by the openings.

12. The VCSEL wafer of claim 1, wherein the strain compensating layer provides strain compensation based on a stress-thickness product of the strain compensating layer.

13. The VCSEL wafer of claim 1, wherein an integrated stress-thickness product of the strain compensating layer is at least approximately 400 Megapascal-meters (MPa-m).

14. The VCSEL wafer of claim 1, wherein VCSELs of the VCSEL wafer are bottom-emitting VCSELs.

15. A vertical-cavity surface-emitting laser (VCSEL), comprising:
   a substrate layer;
   epitaxial layers on the substrate layer; and
   a strain compensating layer to control bowing of a thinned VCSEL wafer by at least partially compensating for compressive strain in the epitaxial layers of the thinned VCSEL wafer,
      wherein the strain compensating layer is arranged outside of the epitaxial layers on an epitaxial side of the substrate layer and between at least a portion of an anode layer and the epitaxial layers.

16. The VCSEL of claim 15, wherein the strain compensating layer is a metal layer with a thickness in a range from approximately 0.2 micrometers to approximately 0.7 micrometers.

17. The VCSEL of claim 15, wherein the strain compensating layer is a Nickel-Chromium (NiCr) layer, a Platinum (Pt) layer, or a Chromium (Cr) layer.

18. The VCSEL of claim 15, wherein the strain compensating layer covers a majority of a surface of a VCSEL wafer.

19. The VCSEL of claim 15, wherein the strain compensating layer is patterned to include an opening via which light is to be emitted by the VCSEL.

20. A thinned wafer of surface-emitting lasers, comprising:
   epitaxial layers on a substrate layer; and
   a strain compensating layer to control bowing of the thinned wafer by at least partially compensating for compressive strain in the epitaxial layers of the thinned wafer,
      wherein the strain compensating layer is arranged outside of the epitaxial layers on an epitaxial side of the substrate layer and between at least a portion of an anode layer and the epitaxial layers.

* * * * *